(12) United States Patent
Rogers et al.

(10) Patent No.: US 6,469,586 B1
(45) Date of Patent: Oct. 22, 2002

(54) LOW VOLTAGE VOLTAGE-CONTROLLED OSCILLATOR TOPOLOGY

(75) Inventors: John William Mitchell Rogers; Calvin Plett, both of Ottawa (CA)

(73) Assignee: SiGe Semiconductor Inc., Ottawa (CA)

( * ) Notice: Subject to any disclaimer, the term of this patent is extended or adjusted under 35 U.S.C. 154(b) by 0 days.

(21) Appl. No.: 09/645,514

(22) Filed: Aug. 25, 2000

(51) Int. Cl.⁷ ............................................. H03B 5/08
(52) U.S. Cl. ............... 331/117 R; 331/175; 331/177 V; 331/183; 331/167; 331/117 FE
(58) Field of Search ............... 331/117 R, 117 V, 331/167, 183, 117 FE, 175

(56) References Cited

U.S. PATENT DOCUMENTS

| | | | | |
|---|---|---|---|---|
| 5,847,621 A | * | 12/1998 | Gutierrez | 331/117 R |
| 5,937,340 A | | 8/1999 | Fabrice et al. | 455/310 |
| 6,064,277 A | * | 5/2000 | Gilbert | 331/117 R |
| 6,114,919 A | * | 9/2000 | Ajjikuttira et al. | 331/117 R |

FOREIGN PATENT DOCUMENTS

GB 2338849 12/1999

OTHER PUBLICATIONS

Borremans M. et al, "Phase Noise Up–Conversion Reduction for Integrated CMOS VCOS", Electronics Letters, IEE Stevenage, GB, vol. 36, No. 10, May 11, 2000, pp. 857–858, XP000963910, ISSN: 0013–5194, right–hand column, line 19–50; figures 1B, 2A.

Leong J. et al, "A 2,7–V 900–MHZ/1.9–GHZ Dual–Band Transceiver IC for Digital Wireless Communication", IEEE Journal of Solid–State Circuits, IEEE Inc. New York, US, vol. 34, No. 3, Mar. 1999. pp. 286–291, XP000887493. ISSN: 0018–9200, p. 288, right–hand column, line 9—last line.

* cited by examiner

Primary Examiner—Arnold Kinkead

(57) ABSTRACT

Recent trends have seen the desire for lower and lower supply voltages in radio frequency (RF) components as this leads to lower power consumption and, therefore, longer battery life. As well, lower voltages and less current means that mobile products can be made to require fewer battery cells leading to lighter, more compact devices. The present invention discloses a novel topology for providing a low-voltage voltage-controlled oscillator (VCO). The novel topology is based on the negative transconductance oscillator. However, the novel topology of the invention eliminates transistor 'stacking' in the oscillator circuit, thereby allowing the oscillator circuit to be operated at a supply voltage only slightly higher than the turn-on voltage for a single transistor.

18 Claims, 1 Drawing Sheet

LOW VOLTAGE VOLTAGE-CONTROLLED OSCILLATOR TOPOLOGY

FIELD OF THE INVENTION

This invention relates to voltage controlled oscillators (VCOs) and, more particularly, to a novel circuit topology that permits VCOs to operate down to very low supply voltages.

BACKGROUND OF THE INVENTION

Due to the emergence of the mobile telecommunications market, the need for small, inexpensive, and low-power RF circuit components is paramount. By integrating more and more functions on the same die, single-chip transceivers are only now becoming a reality.

One of the major challenges in the design of an inexpensive transceiver system is frequency synthesis of the local oscillator signal. Frequency synthesis is usually done using a phase-locked loop (PLL). A PLL typically contains a phase detector, a filter and a voltage-controlled oscillator (VCO). The feedback action of the loop causes the output frequency to be some multiple of a supplied reference frequency. This reference frequency is generated by the VCO whose output frequency is variable over some range according to an input control voltage.

Despite numerous advances in the art, VCOs still remain as one of the most critical design components in RF transceivers. The most important parameters of a VCO are phase noise, power consumption and frequency tuning range. Specifically, it is of major importance to build low-power, low-phase-noise oscillators. This has only been possible with oscillators based on the resonance frequency of an inductor-capacitor (LC) tank circuit.

Traditionally, RF designers have always used external resonator elements for this tank circuit to achieve good phase noise performance. However, higher degrees of integration are desirable because they lead to lower manufacturing costs due to reduced board complexity and improved reliability. While offering the advantages of low cost and reduced sensitivity to packaging parasitics, VCOs comprising integrated LC resonators suffer from the low quality-factor (Q) of the inductor used in the LC tank circuit. This, in turn, leads to poorer noise performance for a given level of power consumption.

On-chip voltage controlled oscillators (VCOs), therefore, continue to be a subject of intense research as designers struggle to meet phase noise requirements using low Q-factor on-chip inductors. However, as technologies progress and on-chip inductor Qs continue to rise due to thicker metalisation and especially with the introduction of copper (Cu) interconnects into some advanced processes, their performance will continue to improve. Higher Q inductors lead to lower loss oscillators because a higher Q-factor means a higher parallel resistance of the tank at resonance. This implies a larger oscillation amplitude and a reduced output noise spectral density, for the same current consumption. Undoubtedly, then, on-chip VCOs will become more widely used in receiver integrated circuits (ICs), resulting in low-cost highly integrated ICs.

A perfectly lossless resonant circuit is very nearly an oscillator, but lossless elements are difficult to realize. Overcoming the energy loss implied by the finite Q of practical resonators with the energy supplying action of active elements is one potentially attractive way to build practical oscillators. The basic ingredients in all LC feedback oscillators, then, are simple: one transistor plus a resonator. In theory, there is no limit to the number of ways to combine a resonator with a transistor or two to make an oscillator.

A number of designers have used the differential Colpitts common-collector and common-base VCO configurations with reasonably good results. These configurations usually provide good output power, are insensitive to parasitics and have relatively good phase noise performance. However, compared to the simpler negative transconductance ($-G_m$) oscillator that has been gaining popularity over the last few years, they call for a complicated circuit with complicated biasing requirements.

In order to guarantee oscillation, the net resistance across the LC tank of an oscillator must be negative. This negative resistance is used to offset the positive resistance of all practical resonators, thereby overcoming the damping losses and reinforcing the oscillation. The negative transconductance ($-G_m$) oscillator uses a cross-coupled differential pair to synthesize the negative resistance.

The basic topology for the $-G_m$ oscillator is shown in FIG. 1. The oscillator may be viewed as consisting of three parts: an LC resonant tank comprising an inductor L and varactors $C_{var}$, a negative resistance generation (positive feedback) network comprising bipolar npn transistors Q1 and Q2 and a biasing network comprising a current source $I_{bias}$. Bipolar npn transistors Q1 and Q2 form a negative resistance generator in parallel with the LC tank that sets the frequency of oscillation. From the point of view of the LC tank the active circuitry (i.e. transistors Q1 and Q2) cancels the losses due to the finite Q of the LC resonator tank Varactors $C_{var}$ are used in place of fixed capacitors to provide a tuning scheme using a control voltage $V_{cont}$ applied via a resistor $R_{cont}$. The supply voltage $V_{cc}$ is fed into the circuit through the center tap of a symmetric differential inductor L. A single inductor is usually preferred in this implementation because of the superior quality factor Q and reduced chip area compared with using two inductors connected in series. Finally, in order to maintain a constant total current shared by the two transistors, a large emitter resistance must be realized. A constant current source $I_{bias}$ is typically used to simulate this high resistance because the large voltage drop associated with large resistors makes them very impractical for this application.

The current source $I_{bias}$ aids in controlling the swing of the oscillator and may be implemented with any of the common current generator circuits already in existence. It is apparent, then, that the circuit of FIG. 1 will contain a minimum of two transistors 'stacked' on top of one another (one transistor from the differential pair and one transistor from the current source). Accordingly, the VCO of FIG. 1 will require a minimum supply voltage $V_{cc}$ equal to twice the turn-on voltage of a typical transistor. It is this stacking of transistors, therefore, which limits the minimum supply voltage at which a VCO may operate.

Recent trends have seen the desire for lower and lower supply voltages in radio frequency (RF) components as this leads to lower power consumption and, therefore, longer battery life. As well, lower voltages and less current means that mobile products can be made to require fewer battery cells leading to lighter, more compact devices. To achieve good phase noise from VCOs at low supply voltages is, however, among the toughest challenges facing the RF designer. This is due to the fact that the phase noise of the VCO is dependent on the output power and, therefore, on the voltage swing of the oscillator. Therefore, as the supply voltage drops, then so does the available voltage swing of the oscillator. Oscillator designers, therefore, do not generally like to lower the supply voltages of their circuits because of this negative impact on performance. They will, therefore, do so only as a last resort.

Furthermore, VCOs are not generally well understood in the design community. As a result, designers are often hesitant to try new topologies primarily because they are unsure of how they will perform. As such, most designers have a small number of 'favorite' oscillator circuits that they adapt to meet changing performance requirements.

SUMMARY OF THE INVENTION

The present invention discloses a novel topology for a low-voltage voltage-controlled oscillator (VCO). In particular, the invention is based on the topology of a negative transconductance oscillator due to its intrinsically simple biasing scheme.

According to a broad aspect of the invention, a voltage-controlled oscillator circuit for use with a low-voltage power supply is provided. The oscillator circuit has a parallel resonant network connected to a first power rail and a pair of controllable current sources connected to the resonant network to form a negative resistance generation network. Each controllable current source of the pair has a first and second conducting terminal and a control terminal. The pair of controllable current sources is arranged so that the first conducting terminal of the first controllable current source is AC coupled to the control terminal of the second controllable current source. Similarly, the first conducting terminal of the second controllable current source is AC coupled to the control terminal of the first controllable current source. The second conducting terminal of each controllable current source is connected to a second power rail, preferably ground. Finally, a biasing network connected between the first and second power rails is coupled to the control terminal of each controllable current source of the negative resistance generation network to bias the controllable current sources with DC current.

The topology of the present invention eliminates transistor stacking and, in so doing, allows the VCO to operate down to very low supply voltages. Low voltage operation is very desirable for wireless circuits because they are often put into products that operate from a battery power supply. Low-voltage operation translates into lower power consumption and, therefore, longer battery life. Advantageously, mobile products can then be made to require fewer battery cells leading to lighter, more compact devices.

Other aspects and features of the present invention will become apparent to those ordinarily skilled in the art upon review of the following description of specific embodiments of the invention in conjunction with the accompanying drawings.

DESCRIPTION OF THE PREFERRED EMBODIMENTS

Figure 1:
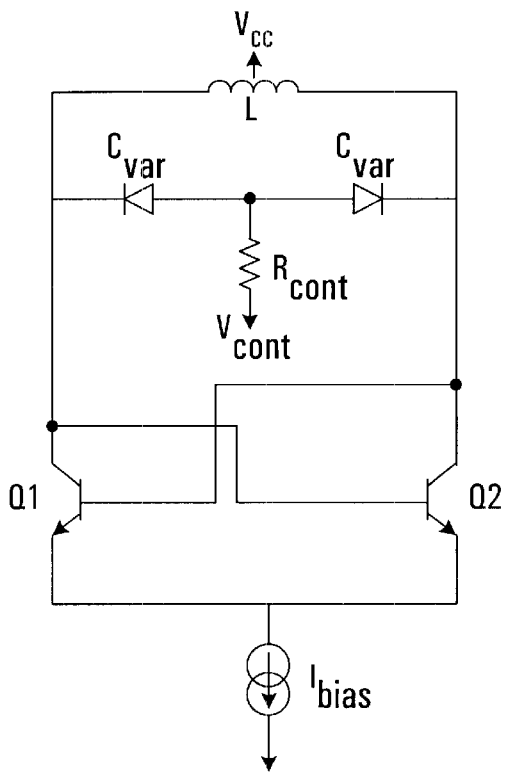
FIG. 1 depicts the conventional topology for a negative transconductance voltage controlled oscillator.
Figure 2:
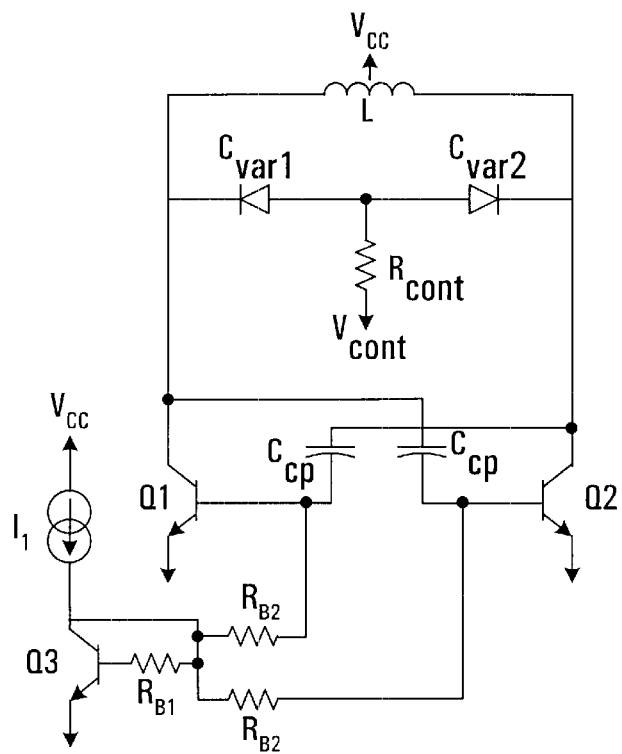
FIG. 2 shows the topology of a low-voltage negative transconductance voltage controlled oscillator according to the present invention.

FIG. 2 depicts the circuit topology of a low-voltage voltage-controlled oscillator (VCO) according to the present invention. The topology is based on the negative transconductance ($-G_m$) oscillator of FIG. 1 due to its intrinsically simple biasing scheme. As before, the oscillator may be viewed as consisting of three parts: an LC resonant tank, a negative resistance generation (or positive feedback) network and a biasing network.

The LC resonant tank comprises a symmetric differential inductor L, a first varactor $C_{var1}$, a second varactor $C_{var2}$ and a control resistor $R_{cont}$. The cathode of the first varactor $C_{var1}$ is connected to one end of the inductor L while the cathode of the second varactor is connected to the other end of the inductor L. The anodes of the varactors $C_{var1}$, $C_{var2}$ are coupled together and to one end of a control resistor $R_{cont}$, to whose other end is applied a bias control voltage $V_{cont}$. A supply voltage Vcc operating as a first power rail is fed into the circuit through the center tap of the symmetric differential inductor L.

Varactors $C_{var1}$, $C_{var2}$ are used in place of fixed capacitors to provide a tuning scheme for the oscillator. Such capacitors may be provided by the junction capacitor formed with a p+ diffusion in an n-well, for example. Tuning of the effective capacitance is controlled with the application of an appropriate bias control voltage $V_{cont}$ at the control resistor $R_{cont}$.

The negative resistance generation network (or positive feedback network) comprises a first npn transistor Q1 and a second npn transistor Q2 arranged to form a cross-coupled differential pair. The npn transistors Q1, Q2 each consist of a collector terminal, a base terminal and an emitter terminal. The collector of transistor Q1 is connected through a first coupling capacitor $C_{cp}$ to the base of transistor Q2. Similarly, the collector of transistor Q2 is coupled through a second coupling capacitor $C_{cp}$ to the base of transistor Q1. The collector of transistor Q1 is also connected to the junction between the inductor L and the cathode of the first varactor $C_{var1}$. Likewise, the collector of transistor Q2 is connected to the junction between the inductor L and the cathode of the second varactor $C_{var2}$. The emitters of the first and second transistors Q1, Q2 are grounded.

The biasing network sets the DC current level flowing through the transistors Q1, Q2 of the negative resistance generation network. It consists of a third npn transistor Q3, a first bias resistor $R_{B1}$, second and third bias resistors $R_{B2}$ and a current source $I_1$. The collector of the third transistor Q3 is tied to the supply voltage VCC through the current source $I_1$. The base of the third transistor Q3 is connected to its collector via the first bias resistor $R_{B1}$. The junction between the first bias resistor $R_{B1}$ and the collector of the third transistor Q3 is connected through the second bias resistor $R_{B2}$ to the base of the first transistor Q1 of the negative resistance generation network. The junction between the first bias resistor $R_{B1}$ and the collector of the third transistor Q3 is also connected to the base of the second transistor Q2 via the third bias resistor $R_{B2}$. As in the case of the first and second transistors Q1 and Q2, the emitter of the third transistor Q3 connected to a second power rail, namely ground.

It is noted that the biasing network is "open-loop" in the sense that it provides bias current independent of any output signal from the VCO.

The basic operation of the circuit of FIG. 2 is as follows. When the LC tank is excited by noise or some other signal, a voltage difference is developed across the tank which will "ring" or produce a sinusoidal waveform in response to the excitation. The frequency of this "ringing" voltage will be determined by the values of the inductor L and capacitors $C_{var1}$, $C_{var2}$ forming the LC tank.

As in all real circuits, however, there will be losses, either intentional or parasitic. Therefore, the ringing oscillation will be damped and will eventually stop if left alone. Since it is desirable for the oscillations to continue indefinitely, active circuitry must be included around the LC tank to overcome tank losses and reinforce the oscillation.

Therefore, the role of the negative resistance generation (positive feedback) network is to give the oscillation a boost at the top and bottom of each voltage swing to keep the current oscillating. The first and second transistors Q1 and Q2 form a negative resistance generator in parallel with the LC tank to overcome the losses of the resonant tank that would otherwise dampen the oscillation.

In the present invention, the bases of the transistors Q1, Q2 are DC de-coupled from the collectors using the capacitors $C_{cp}$. However, in order for the active circuitry to function, the cross-coupled transistors Q1, Q2 must be biased with DC current. This is precisely the function of the biasing network in FIG. 2. By removing the current source of FIG. 1, the current is controlled by mirroring the current flowing through the current source $I_1$, into the transistors Q1 and Q2. Since the base of each transistor Q1, Q2 draws very little current, the voltage drop across $R_{B1}$ and $R_{B2}$ will be small. The base voltages of all three transistors Q1, Q2 and Q3 will, therefore, be the same. Thus, the current flowing through the transistors Q1, Q2 and into the LC tank will be some exact multiple of the current $I_1$. In other words, the biasing network takes the reference current $I_1$, and mirrors it into the tank.

For example, if $R_{B1}=k*R_{B2}$ and Q1 and Q2 are k times as large as Q3, then the current flowing through the collectors of the transistors Q1, Q2 will be k times $I_1$. This multiplication ratio is set by appropriately choosing the third transistor Q3 and the resistors $R_{B1}$, $R_{B2}$. Since the first and second transistors Q1, Q2 are forced to have the same base voltage (or gate voltage if they were NMOS devices), they have to have the same collector currents comparable to their relative sizes. And because the collectors must have a different voltage than the bases of the transistors Q1 and Q2, the coupling capacitors $C_{cp}$ are placed in the paths connecting these two nodes. As such, the feedback network remains functional, but the DC voltage levels can still be different.

Advantageously, the topology of FIG. 2 has the effect of removing any transistor 'stacking' and allows the oscillator circuit to be operated at a supply voltage $V_{cc}$ only slightly higher than the turn-on voltage for a single transistor. It should be noted that the capacitor $C_{cp}$ is a short circuit at radio frequencies and, in effect, allows the base and collector to have different DC bias levels.

With regards to actual implementation of the invention, transistors Q1 and Q2 should be made as large as possible to lower their noise contribution to the oscillator. However, if they are made too large, then their parasitic capacitance will limit the frequency of oscillation. Therefore, there is a practical maximum value on the size of the transistors.

Transistor Q3 is chosen to be some small fraction of the size of transistors Q1 and Q2, so that little additional current is wasted in the bias circuitry. Likewise, biasing resistors $R_{B2}$ and $R_{B1}$ are set to this same ratio. However, the value of $R_{B1}$ should be set to be a large value to avoid effecting the noise figure of the transistors and to also prevent the loss of RF energy through the biasing network.

For the LC tank, the values of the inductor L and capacitors $C_{var1}$, $C_{var2}$ will be set by the desired frequency of oscillation. Usually, the inductor L is chosen as large as practically possible and the values of $C_{var1}$ $C_{var2}$ are then adjusted to give the desired frequency.

Finally, the collector of each transistor Q1 and Q2 comprising the cross-coupled transistor pair is AC coupled to the base of the corresponding transistor. Any element that provides an AC short circuit and a DC open circuit may, in fact, be substituted for the coupling capacitors $C_{cp}$ of FIG. 4. However, if coupling capacitors $C_{cp}$ are used, they should be A chosen large enough so as to provide lots of feedback around the cross-coupled transistor pair Q1, Q2. Care should be taken since if they are chosen too large, the parasitic capacitance to the substrate will cause an unacceptable amount of signal loss.

As an example, a particular application may call for a 5 GHz VCO. To provide such an implementation, the circuit components may be selected in accordance with the above guidelines to yield a set of values with Q1 and Q2=10 um, Q3=2 um, $C_{cp}$=1 pF, $C_{var1}=C_{var1}$=40 fF, $R_{B1}$=5 kΩ, $R_{B2}$=50 kΩ, L=1.6 nH and $R_{cont}$=5 Ω.

Operating an oscillator according to the present invention will generate even mode harmonics that will shift bias levels in the circuit. This may, in turn, cause the absolute value of the operating DC current to be hard to control and/or to predict in this circuit. Designers are often hesitant to make the bias current dependent on the base voltage for this reason. Simulation shows that the current does settle to a reasonable value, however, and even if it is not predicted accurately, the circuit is still useful.

In terms of performance, it may appear at first glance that decoupling the emitters of transistors Q1 and Q2 will cause the oscillator to cease to function or cause the two halves of the circuit to oscillate at an arbitrary phase relative to one another. Simulation shows that this is not the case.

Some designers may also believe that placing any resistance at the bases of transistors Q1 and Q2 will destroy the phase noise performance of the circuit. However, this is not the case at all, and will be insignificant compared to other sources of noise.

Traditionally, oscillator designers have discarded the idea of trying to build VCOs operating at or below 1.2 volts because variable capacitors (or varactors), without a larger available voltage swing, will not have sufficient tuning capability to give useful tuning ranges for the VCO. However, technology is overcoming this obstacle by introducing varactors with greater tuning ranges.

As a final note, the circuit topology of the present invention has been illustrated only using bipolar technology. However, as will be apparent to those skilled in the art, this is merely a matter of preference to the designer. Indeed, a transistor is simply a controllable current source and all RF circuits may, therefore, be implemented in any accomodating technology. Accordingly, the topology of the present invention may alternatively be implemented using CMOS, GaAs, MESFETs, JFETs, vacuum tubes or any other technology that provides a suitable voltage-controlled or current-controlled current sources.

While preferred embodiments of the invention have been described and illustrated, it will be apparent to one skilled in the art that numerous modifications, variations and adaptations may be made without departing from the scope of the invention as defined in the claims appended hereto.

What is claimed is:

1. A voltage-controlled oscillator circuit for use with a low-voltage power supply, the oscillator circuit comprising:
   a parallel resonant network connected to a first power rail;
   a pair of controllable current sources connected to the resonant network to form a negative resistance generation network, each controllable current source having a first and second conducting terminal and a control terminal, the pair of controllable current sources being arranged so that the first conducting terminal of the first controllable current source of the pair is AC coupled to the control terminal of the second controllable current source of the pair, and the first conducting terminal of the second controllable current source of the pair is AC coupled to the control terminal of the first controllable current source of the pair, the second conducting terminal of each controllable current source connected to a second power rail; and an open-loop biasing network connected to the control terminal of each controllable current source of the negative resistance generation network for biasing the controllable current sources with DC current, the open-loop biasing network comprising a current mirror and being connected between the first and second power rails.

2. An oscillator circuit according to claim 1 wherein the pair of controllable current sources are current-controlled current sources.

3. An oscillator circuit according to claim 1 wherein the pair of controllable current sources are voltage-controlled current sources.

4. An oscillator circuit according to claim 1 wherein the parallel resonant network comprises an inductive element and a capacitive element.

5. An oscillator circuit according to claim 4 wherein the capacitive element comprises first and second varactor diodes each having a cathode terminal and an anode terminal, the anodes of the first and second varactor diodes coupled together and connected to a control voltage by means of a resistive element, the capacitance of the capacitive element being variable by adjusting the control voltage.

6. An oscillator circuit according to claim 2 wherein the current-controlled current sources of the negative resistance generation network are bipolar npn transistors each having a collector terminal corresponding to the first conducting terminal, an emitter terminal corresponding to the second conducting terminal and a base terminal corresponding to the control terminal.

7. An oscillator circuit according to claim 3 wherein the voltage-controlled current sources are CMOS transistors.

8. An oscillator circuit according to claim 1 wherein the open-loop biasing network comprises a third controllable current source having first and second conducting terminals and a control terminal, the first conducting terminal of the third controllable current source coupled to the first power rail by means of a current sources the second conducting terminal of the third controllable current source coupled to the second power rail, the control terminal of the third controllable current source connected to a first end of a fast resistor, a second end of the first resistor connected to the first conducting terminal of the third controllable current source, the second end of the first resistor connected to the control terminal of the first controllable current source of the negative resistance generation network via a second resistor, the second end of the first resistor also connected to the control terminal of the second controllable current source of the negative resistance generation network via a third resistor.

9. An oscillator circuit according to claim 8 wherein the controllable current sources are current-controlled current sources.

10. An oscillator circuit according to claim 9 wherein the current-controlled current sources are bipolar npn transistors each having a collector terminal corresponding to the first conducting terminal, an emitter terminal corresponding to the second conducting terminal and a base terminal corresponding to the control terminal.

11. An oscillator circuit according to claim 8 wherein the controllable current sources are CMOS transistors.

12. An oscillator circuit according to claim 1 wherein the second power rail is ground.

13. An oscillator circuit according to claim 4 wherein the open-loop biasing network comprises a third controllable current source having first and second conducting terminals and a control terminal, the first conducting terminal of the third controllable current source coupled to the first power rail by means of a current source the second conducting terminal of the third controllable current source coupled to the second-power rail, the control terminal of the third controllable current source connected to a first end of a first resistor, a second end of the first resistor connected to the first conducting terminal of the third controllable current source, the second end of the first resistor connected to the control terminal of the first controllable current source of the negative resistance generation network via a second resistor, the second end of the first resistor also connected to the control terminal of the second controllable current source of the negative resistance generation network via a third resistor.

14. An oscillator circuit according to claim 13 wherein the controllable current sources are current-controlled current sources.

15. An oscillator circuit according to claim 14 wherein the current-controlled current sources are bipolar npn transistors each having a collector terminal corresponding to the first conducting terminal, an emitter terminal corresponding to the second conducting terminal and a base terminal corresponding to the control terminal.

16. An oscillator circuit according to claim 13 wherein the controllable current sources are CMOS transistors.

17. An oscillator circuit according to claim 4 wherein the second power rail is ground.

18. An oscillator circuit according to claim 8 wherein the second power rail is ground.

* * * * *

UNITED STATES PATENT AND TRADEMARK OFFICE
CERTIFICATE OF CORRECTION

PATENT NO.     : 6,469,586 B1                                   Page 1 of 1
DATED          : October 22, 2002
INVENTOR(S)    : John William Mitchell Rogers et al.

It is certified that error appears in the above-identified patent and that said Letters Patent is hereby corrected as shown below:

Title page,
Item [54], Title, insert -- A -- before "LOW VOLTAGE.."

Column 7,
Line 49, change "sources" to -- source --
Line 52, change "fast" to -- first --

Column 8,
Line 25, change "sources" to -- source --
Line 27, change "second-power" to -- second power --

Signed and Sealed this

Twenty-fifth Day of February, 2003

JAMES E. ROGAN
*Director of the United States Patent and Trademark Office*